United States Patent [19]

Hoover

[11] 4,355,287

[45] Oct. 19, 1982

[54] BRIDGE AMPLIFIERS EMPLOYING COMPLEMENTARY FIELD-EFFECT TRANSISTORS

[75] Inventor: Merle V. Hoover, Flemington, N.J.

[73] Assignee: RCA Corporation, New York, N.Y.

[21] Appl. No.: 192,363

[22] Filed: Sep. 30, 1980

[51] Int. Cl.³ .............................................. H03F 3/26
[52] U.S. Cl. .................................. 330/264; 330/146;
330/275; 330/300
[58] Field of Search ............... 330/117, 146, 263, 264, 330/269, 275, 300; 307/585

[56] References Cited

U.S. PATENT DOCUMENTS

| | | | |
|---|---|---|---|
| 3,548,330 | 12/1970 | Rosenstein | 330/265 X |
| 4,117,415 | 9/1978 | Hoover | 330/264 |
| 4,254,380 | 3/1981 | Guillien | 330/275 |

OTHER PUBLICATIONS

ET/D, Dec. 1980, pp. 26-29, "Hi-Fi Auto Radio" by J. J. Carr.
"CA 3600E COS/MOS Transistor Array", *RCA Linear Integrated Circuit Databook*, SSD-240A, 1978, pp. 282-286.
*RCA Audio Amplifier Manual*, APA-551, 1979, pp. 52, 53, 59.
*RCA Designer's Handbook, Solid-State Power Circuits*, SP-52, 1971, pp. 604-611.

Primary Examiner—James B. Mullins
Attorney, Agent, or Firm—E. M. Whitacre; P. J. Rasmussen; A. J. Jacobson

[57] ABSTRACT

A bridge amplifier is provided wherein one end of a load device is driven by a first amplifier and the other end of the load device is driven by a second amplifier. The second amplifier is an inverting amplifier comprising P and N-channel field-effect transistors, having complementary symmetry conduction characteristics. The input to the second amplifier is directly coupled to the output of the first amplifier.

7 Claims, 4 Drawing Figures

BRIDGE AMPLIFIERS EMPLOYING COMPLEMENTARY FIELD-EFFECT TRANSISTORS

FIELD OF THE INVENTION

This invention pertains to bridge amplifiers for driving a load device wherein at least one end of the load device is driven by an amplifier using complementary field-effect transistors.

BACKGROUND OF THE INVENTION

Bridge amplifiers are useful in audio power amplifiers and in control circuits for delivering bidirectional current to an output load device.

A typical bridge amplifier comprises first and second amplifiers arranged for delivering power to a load device. The load device is connected between the output of the first amplifier and the output of the second amplifier. First and second drive signals, 180 degrees out of phase with each other, are supplied to the respective input terminals of the first and second amplifiers.

Compared to single-ended amplifiers, bridge amplifiers can provide twice the output signal voltage across a load device for the same power supply voltage. This results in four times the power output being delivered to the load. For such reason, bridge amplifiers are particularly useful in automotive or aircraft applications where available battery voltage is limited.

A bridge amplifier employing field-effect transistors (FET's) is described in U.S. Pat. No. 4,117,415, issued to the present applicant and assigned to RCA Corporation. The use of FET's is advantageous in that such devices provide high input impedance, wide dynamic range, square law transfer characteristics for low distortion, relative freedom from thermal runaway, and freedom from secondary breakdown characteristics.

FIG. 1 of U.S. Pat. No. 4,117,415, cited above, shows a bridge amplifier circuit using three pairs of field-effect transistors, each pair arranged as a complementary amplifier configuration, to drive a load device in response to a single-ended input signal. Each complementary-symmetry FET amplifier includes a P-channel FET and an N-channel FET. The respective drain electrode of each FET is connected to a respective output terminal; the respective gate electrode of each FET is connected to a respective input terminal; and an operating potential is impressed across the respective source electrodes. In the bridge amplifier circuit, the first and second pairs of field-effect transistors are arranged as first and second amplifiers for driving respective ends of the load device. The third pair of field-effect transistors serves as an inverting amplifier. The single-ended input signal is connected to drive the input of the first and third amplifiers and the output of the third amplifier is connected to drive the input of the second amplifier. The present invention is directed towards eliminating the third amplifier which provides 180 degrees of phase shift in bridge circuit configurations.

SUMMARY OF THE INVENTION

Bridge amplifiers in accordance with the present invention include a first amplifier arranged with first and second field-effect transistors for driving a load device in response to a single-ended input signal. The output of the first amplifier is connected to one end of the load device. The first and second field-effect transistors are connected as a second amplifier, wherein the second amplifier is an inverting amplifier. The output of the second amplifier is connected to the other end of the load device, and the input of the second amplifier is connected to the output of the first amplifier.

The first amplifier provides both output signal drive to one end of the load drive and input signal drive to the second amplifier. Since the first and second FET's have insulated gate electrodes, a direct coupled connection between the first amplifier output and the second amplifier input is used. Such FET gate isolation prevents the second amplifier from drawing significant input current, which would otherwise cause asymmetrical loading to imbalance the bridge amplifier.

DETAILED DESCRIPTION

Figure 1:
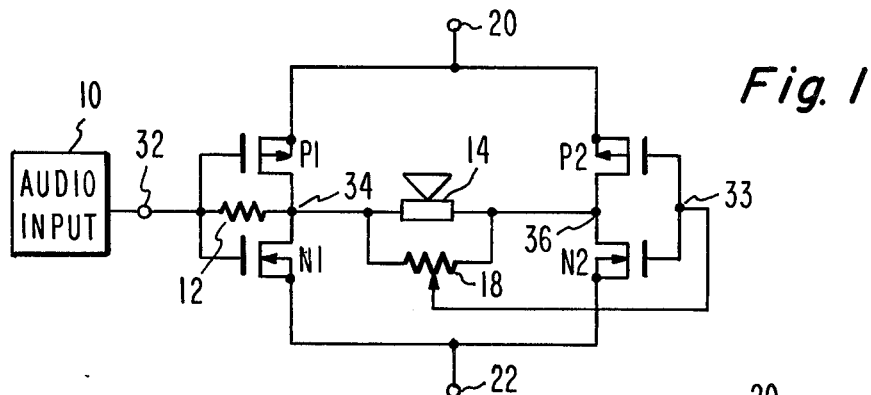
FIG. 1 is a schematic diagram of a bridge amplifier embodying the present invention in an audio amplifier for driving a speaker.

A bridge amplifier, shown in FIG. 1, comprises two enhancement Type P-channel transistors P1, P2, and two enhancement Type N-channel transistors N1, N2. Transistors P1 and N1, which have complementary conductivity characteristics, are arranged as a first complementary symmetry FET amplifier between an input terminal 32 and an output terminal 34. Transistors P2 and N2, which have complementary conductivity characteristics, are arranged as a second complementary symmetry FET amplifier between an input terminal 33 and an output terminal 36.

The characteristics of complementary-symmetry FET amplifiers are well known. A publication by RCA Corporation, Solid State Division, data file 619, describes the operating characteristics and use of complementary-symmetry FET amplifiers. RCA semiconductor product type CA3600, described in the above-referenced publication, contains complementary-symmetry FET devices which are suitable for use in conjunction with the present invention.

A speaker 14 is output load device connected between the respective output terminals 36 and 34 of the first and second FET amplifiers. A potentiometer 18 is connected across speaker 14. The movable arm of the potentiometer 18 is connected to the input terminal 33 of the second FET amplifier.

Terminals 20 and 22 receive an operating potential therebetween. Terminal 20 is connected to a relatively positive potential, V+, while terminal 22 is connected to a relatively negative potential, such as ground. The quiescent operating point for the first FET amplifier, P1, N1, is set by a bias resistor 12 connected between input terminal 32 and output terminal 34. Assuming transistors P1 and N1 have substantially complementary conductivity characteristics, the quiescent operating potential at the gate electrodes of P1 and N1 is equal to $(V+/2)$. The quiescent operating point for the second FET amplifier is set by a direct coupled path from input terminal 33, through a resistance impedance formed by potentiometer 18 and speaker 14, to the output terminal 36. Assuming transistors P2 and N2 also have substantially complementary conductivity characteristics, the quiescent potential at the gate electrode of P2 and N2 is also $(V+/2)$. Therefore, the quiescent operating output potentials at respective output terminals 34 and 36 are substantially equal so that under quiescent operating conditions no current flows through the speaker 14 and potentiometer 18.

The bridge circuit of FIG. 1 is used as an audio amplifier by connecting a suitable source of audio signal 10 to input terminal 32. The input signal is amplified by a voltage gain factor of the first amplifier P1, N1 to develop an output signal at terminal 34. The first amplifier P1, N1 also inverts the input signal so that the drive signal to one end of the speaker 14 at terminal 34 is 180 degrees out of phase with the input signal at terminal 32.

Potentiometer 18 attenuates the signal at terminal 34 for application to the input terminal 33 of the second amplifier P2, N2. The second amplifier P2, N2 inverts the signal at its input terminal 33 and applies an output signal at terminal 36 to the other end of the speaker 14. Thus, the second amplifier provides a drive signal to the other end of the speaker 14, which drive signal is in phase with the audio input signal at terminal 32.

It is desirable that a bridge amplifier apply substantially equal and opposite (i.e. balanced) drive signals to speaker 14 to reduce distortion. However, since the input to the second amplifier P2, N2 is derived from the output of the first amplifier P1, N1, the drive signal at the output 36 of the second amplifier tends to be greater than the drive signal at the output 34 of the first amplifier. Therefore, the voltage attenuation factor of potentiometer 18 is adjusted to substantially compensate for the gain factor of the second amplifier P2, N2 so that the magnitude of the product of the attenuation factor of potentiometer 18 and the voltage gain factor of the second amplifier P2, N2 is substantially equal to minus 1. The voltage signal at terminal 34 is therefore inverted by the combination of potentiometer 18 and the second amplifier P2, N2 so as to provide substantially equal and opposite drive signals at terminals 34 and 36.

It is noted that the gate electrodes of transistors P2 and N2 are insulated from their respective channels. Therefore, substantially no current (whether dc bias current or signal current) is drawn by the gate electrodes of the FET transistors P2, N2, which current would otherwise imbalance the bridge, causing distortion. The isolation provided by the gate electrodes of P2 and N2 avoids the need for dc isolation or intermediate isolating amplifier stages between the output of the first amplifier and the input to the second amplifier. Thus, the first amplifier may comprise a variety of different configurations.

Figure 2:
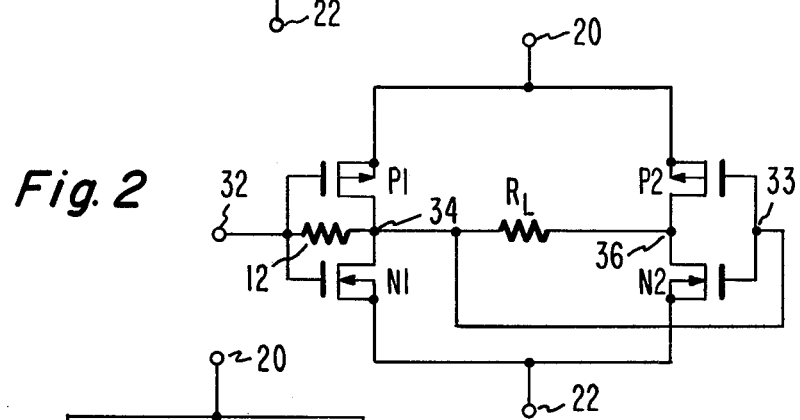
FIGS. 2, 3 and 4 are schematic diagrams, each illustrating alternate embodiments of bridge amplifiers employing the present invention.

In FIG. 2, both the first and second inverting amplifiers P1 and N1, P2 and N2, have essentially unity voltage gain. To achieve a unity voltage gain, the load device $R_L$ and the respective composite transconductance ($g_m$) of both the first and second amplifiers are chosen so that the respective resulting product of $g_m$ and $R_L$ is essentially unity for both the first and second amplifiers. The potentiometer 18 in FIG. 1 can thus be eliminated, and the input 33 of the second amplifier of P2, N2 is connected directly to the output of the first amplifier P1, N1 at terminal 34.

While the amplifier of FIG. 2 provides no voltage gain, a substantial power gain is realized. For example, when using RCA semiconductor product type CA3600 an input current of five picoamperes at a given voltage can modulate an output current of 2.2 milliamperes at the same given voltage level.

Although bridge amplifiers which use FET transistors in both the first and second amplifiers is the preferred embodiment of the present invention, a pair of complementary FET transistors may be arranged with a first amplifier to form a bridge amplifier circuit. In such manner, existing amplifiers may be operated as part of a bridge amplifier for increasing the power delivered to a load device.

Figure 3:
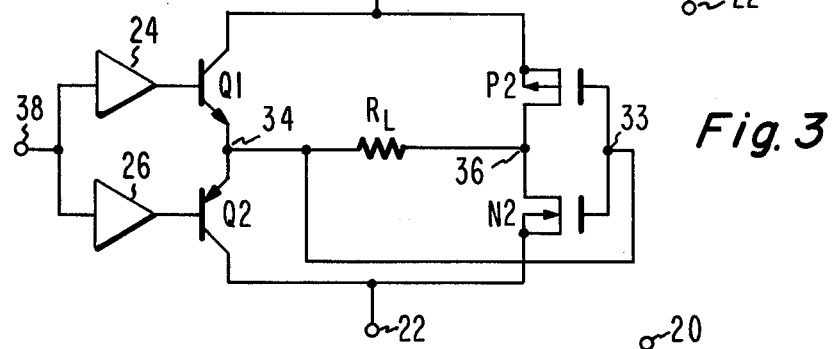

For example, in FIG. 3, a first amplifier is shown comprising bipolar transistors Q1 and Q2 arranged as complementary emitter-follower amplifiers. Input buffers 24 and 26 condition the input signal at terminal 38 to drive transistors Q1 and Q2 respectively. The input buffers 24 and 26 also provide respective bias currents to transistors Q1 and Q1 so that, under quiescent operating conditions, the voltage at terminal 34 is equal to that at terminal 36.

The first amplifier Q1, Q2 is essentially a single-ended amplifier responsive to an input signal at terminal 38 to provide a drive signal at terminal 34 to one end of the load device $R_L$. A bridge amplifier is completed by the complementary amplifier comprising FET's P2 and N2 in a similar arrangement as that shown in FIG. 2.

For the circuit of FIG. 3, transistors Q1 and Q2 function as a non-inverting amplifier having substantially unity gain. The second amplifier P2, N2 is therefore arranged to provide a signal inversion and essentially unity gain. Towards this end, the impedance of the load device $R_L$ and the composite transconductance $g_m$ of transistors P2 and N2 are chosen such that P2 and N2 function as a unity-gain inverting amplifier.

Figure 4:
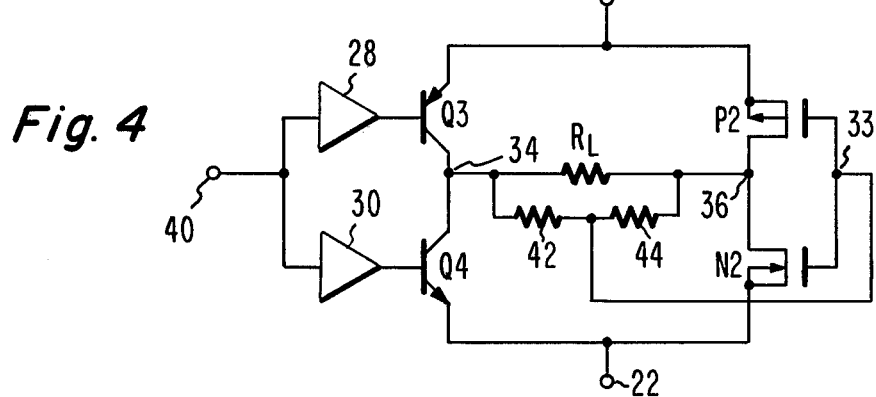

In FIG. 4, a first amplifier comprises bipolar transistors Q3 and Q4 arranged as complementary common-emitter amplifying stages. The two input buffers 28 and 30 provide respective quiescent bias for transistors Q3 and Q4 as well as condition the input signal at terminal 40 to drive Q3 and Q4. As in FIGS. 1, 2 and 3, complementary FET amplifier P2, N2 is connected to provide signal inversion. However, the input of amplifier P2, N2 is connected to the output of a fixed attenuator comprising the series connection of resistors 42 and 44 connected across load drive $R_L$. The attenuation factor of the voltage divider network 42, 44 and the voltage gain factor of the second amplifier P2, N2 are chosen so that the magnitude of the product of these factors is substantially equal to minus 1.

It will be appreciated that modifications to the arrangements of FIGS. 1-4 may be made within the scope of the present invention. For example, the first amplifier can assume other configurations than those shown. Thus, the first amplifier may comprise complementary FET's arranged in a source follower configuration, or two bipolar transistors of the same conductivity type arranged as a quasi complementary push-pull amplifier. Furthermore, while enhancement type FET's, are disclosed in the preferred embodiment, depletion type FET's may also be used.

Bridge amplifiers of the present invention may be conveniently biased for the desired mode of operation. For example, in FIG. 1, the operating potential applied between terminals 20 an 22 determines the mode of operation. If the value of the operating potential is chosen to be on the order of the sum of the threshold voltage corresponding to the P-channel transistors plus the threshold voltage corresponding to the N-channel transistors, the circuit is biased for class B operation. As the operating potential is increased, the mode of circuit operation progresses into the class AB mode and eventually reaches a level at which the circuit is biased for class A operation.

A complementary symmetry FET amplifier may also be biased for a desired mode of operation by inserting a resistance between the gate electrodes thereof and providing a current through such resistance. Techniques for biasing complementary FET amplifiers may be found in a pending patent application Ser. No. 096,739, filed Nov. 23, 1979, entitled "Complementary Field-Effect Transistor Amplifier With Cross-Over Current Control", which application is assigned to RCA Corporation.

Finally, although the load device $R_L$ is represented as a resistor, a complex impedance load device may also be driven at the circuit shown. For example, the load device $R_L$ may be a solenoid for providing bidirectional mechanical motion. The resulting direction of motion corresponds to the direction of current through the solenoid coil. The direction of current is controlled by the polarity of the input signal at terminal 32. Since the input to the second amplifier P2, N2 is directly coupled to the output of the first amplifier, the frequency response of the circuit extends down to dc.

These and other modifications are intended to be within the scope of the present invention as defined by the following claims.

What is claimed is:

1. A bridge amplifier for driving a load device having first and second terminals, said bridge amplifier comprising:

first amplifier means connected to an input terminal for providing a signal at the first terminal of said load device;

second amplifier means for providing a signal at the second terminal of said load device, said second amplifier means comprising first and second field-effect transistors of opposite conductivity type, each having respective source, drain, and gate electrodes, the respective source electrodes of said first and second field-effect transistors being arranged for receiving an operating potential therebetween, the drain electrodes of said first and second field-effect transistors being connected to said second terminal of said load device, and the gate electrodes of said first and second field-effect transistors being interconnected without substantial intervening impedance; and coupling means for direct coupling without intervening amplification the output signal of said first amplifier means to the interconnection of the gate electrodes of said first and second field-effect transistors;

wherein said load device exhibits an impedance, said second amplifier means exhibits a transconductance determined by respective transconductances of said first and second field-effect transistors, and said coupling means exhibits an attenuation factor: said impedance, said transconductance and said attenuation factor being chosen so that their product is substantially equal to minus unity.

2. A bridge amplifier according to claim 1 wherein said coupling means comprises:

an attenuator means responsive to the output signal of said first amplifier means for attenuating such output signal by an attenuation factor and applying such attenuated output signal to the interconnection gate electrodes of said first and second field-effect transistors.

3. A bridge amplifier according to claim 2 wherein said attenuating means comprises a voltage divider network having first and second terminals and an output terminal, said respective first and second terminals of said voltage divider being connected to respective first and second terminals of said load device, and said output terminal of said voltage divider being connected to the interconnection gate electrodes of said first and second field-effect transistors.

4. A bridge amplifier according to claim 3 wherein said first amplifier means comprises third and fourth field-effect transistors of opposite conductivity type, each having respective source, drain and gate electrodes, said third field-effect transistor being of the same conductivity type as said field-effect transistor, the drain electrodes of said third and fourth field-effect transistor being connected to said first terminal of said load device, the respective source electrodes of said third and fourth field-effect transistors being arranged for receiving said operating potential therebetween, and the gate electrodes of said third and fourth field-effect transistors being connected to said input terminal.

5. A bridge amplifier according to claim 1 wherein said coupling means includes a direct connection without substantial intervening impedance between the first terminal of said load device and the interconnection of the gate electrodes of said first and second field-effect transistors, whereby said attenuation factor is unity.

6. An audio amplifier for driving a speaker having first and second terminals, said audio amplifier comprising:

first amplifier means connected to an input terminal for providing a signal at the first terminal of said speaker;

second amplifier means for providing a signal at the second terminal of said speaker, said second amplifier means comprising first and second field-effect transistors of opposite conductivity type, each having respective source, drain, and gate electrodes, the respective source electrodes of said first and second field-effect transistors being arranged for receiving an operating potential therebetween, the drain electrodes of said first and second field-effect transistors being connected to said second terminal of said speaker, and the gate electrodes of said first and second field-effect transistors being interconnected without substantial intervening impedance; and coupling means for direct coupling without intervening amplification the output signal of said first amplifier means to the interconnection of the gate electrodes of said first and second field-effect transistors;

wherein said speaker exhibits an impedance, said second amplifier means exhibits a transconductance determined by respective transconductances of said first and second field-effect transistors, and said coupling means exhibits an attenuation factor: said impedance, said transconductance and said attenuation factor being chosen so that their product is substantially equal to minus unity.

7. An audio amplifier according to claim 6 wherein said coupling means includes a direct connection without substantial intervening impedance between the first terminal of said speaker and the interconnection of the gate electrodes of said first and second field-effect transistors, whereby said attenuation factor is unity.

* * * * *

UNITED STATES PATENT AND TRADEMARK OFFICE
CERTIFICATE OF CORRECTION

PATENT NO. : 4,355,287
DATED : October 19, 1982
INVENTOR(S) : Merle Vincent Hoover It is certified that error appears in the above-identified patent and that said Letters Patent is hereby corrected as shown below:

Column 5, line 67    after "tion" insert --of the--.

Column 6, line 8     after "interconnection" insert --of the--.

Column 6, line 15    after "said" insert --first--.

Signed and Sealed this

Twenty-fifth Day of January 1983

[SEAL]

Attest:

Attesting Officer

GERALD J. MOSSINGHOFF

Commissioner of Patents and Trademarks